US008653558B2

(12) United States Patent
Green et al.

(10) Patent No.: US 8,653,558 B2
(45) Date of Patent: Feb. 18, 2014

(54) SEMICONDUCTOR DEVICE AND METHOD OF MAKING

(75) Inventors: Bruce M. Green, Gilbert, AZ (US); Jenn Hwa Huang, Chandler, AZ (US); Weixiao Huang, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 40 days.

(21) Appl. No.: 13/273,622

(22) Filed: Oct. 14, 2011

(65) Prior Publication Data
US 2013/0092947 A1    Apr. 18, 2013

(51) Int. Cl.
*H01L 29/66* (2006.01)
*H01L 21/337* (2006.01)

(52) U.S. Cl.
USPC ........... 257/183; 257/192; 257/194; 257/197; 257/E29.248; 257/E21.403; 257/E21.407; 438/60; 438/167; 438/172; 438/285

(58) Field of Classification Search
USPC .................. 257/197, 194, 192, 183, E29.248, 257/E21.403, E21.407; 438/60, 167, 172, 438/285
See application file for complete search history.

(56) References Cited

U.S. PATENT DOCUMENTS

| 2007/0241419 | A1 | 10/2007 | Green et al. | |
| 2008/0087916 | A1* | 4/2008 | Amasuga et al. | 257/194 |
| 2008/0210988 | A1* | 9/2008 | Twynam | 257/260 |
| 2010/0127275 | A1 | 5/2010 | Takehiko et al. | |
| 2010/0148184 | A1* | 6/2010 | Takehiko et al. | 257/76 |
| 2010/0155720 | A1* | 6/2010 | Kaneko | 257/43 |

FOREIGN PATENT DOCUMENTS

EP    2088619 A1    8/2009

OTHER PUBLICATIONS

Shi, J., et al., "High performance AlGaN/GaN power switch with $HfO_2$ insulation", Applied Physics Letter 95, 042103, 2009 American Institute of Physics.

* cited by examiner

*Primary Examiner* — Long K Tran
(74) *Attorney, Agent, or Firm* — Mary Jo Bertani; James L. Clingan, Jr.

(57) ABSTRACT

In some embodiments, a metal insulator semiconductor heterostructure field effect transistor (MISHFET) is disclosed that has a source, a drain, an insulation layer, a gate dielectric, and a gate. The source and drain are on opposing sides of a channel region of a channel layer. The channel region is an upper portion of the channel layer. The channel layer comprises gallium nitride. The insulation layer is over the channel layer and has a first portion and a second portion. The first portion is nearer the drain than the source and has a first thickness. The second portion is nearer the source than drain and has the first thickness. The insulation layer has an opening through the insulation layer. The opening is between the first portion and the second portion.

20 Claims, 6 Drawing Sheets

SEMICONDUCTOR DEVICE AND METHOD OF MAKING

BACKGROUND

1. Field

This disclosure relates generally to semiconductor devices, and more specifically, to Gallium Nitride (GaN) metal insulator semiconductor heterostructure field effect transistors (MISHFETs) and metal oxide semiconductor heterostructure field effect transistors (MOSHFETs).

2. Related Art

As electric power systems in cars, appliances, and other commercial and industrial applications demand higher and higher efficiency, this increases the demand for highly efficient DC to AC power inverters and DC to DC boost converters. Such inverters and boost converters require high efficiency transistors. Gallium nitride (GaN) transistors have started to emerge as the technology of choice for highly efficient transistors with low on-resistance and extremely high breakdown voltage. Transistors derived from AlGaN/GaN heterostructures enjoy high breakdown and low on-resistance because GaN has inherently high breakdown field strength and AlGaN/GaN heterojunctions have very high electron sheet density. The high breakdown field strength and high electron sheet density arise from the wide 3.4 eV bandgap of GaN. This bandgap is much wider than competing semiconductor technologies such as Si with a 1 eV bandgap and GaAs with a 1.6 eV bandgap.

Power devices generally require that the ratio to the on-current to off-current have a value of $10^7$ or greater since at very high voltages, even a small amount of drain leakage current at a high standby voltage—for example 500-1000 V or even higher—consumes a large amount of power. As a result, the efficiency then suffers. In a field effect transistor, gate leakage can dominate drain leakage; negative gate current predominately manifests itself at the drain contact.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of devices and methods disclosed herein provide Gallium Nitride (GaN) metal insulator semiconductor heterostructure field effect transistors (MISHFETs) and metal oxide semiconductor heterostructure field effect transistors (MOSHFETs) that overcome gate leakage limitations in GaN field-effect transistors while shielding the un-gated regions of the device from process chemicals and high-temperature anneals. In one embodiment, SiN is deposited on the wafer surface and then ohmic contacts and either mesa and/or implant device isolation are formed. A gate channel is then etched and the surface is cleaned with ammonium hydroxide, buffered oxide etch (BOE) and/or ozone cleaning. Gate dielectric is deposited on top of the etched gate channel as well as over the remaining structure. The gate dielectric layer is annealed using standard annealing in $N_2$ or $O_2$. Chlorine-based or other appropriate chemistry is used to dry-etch the gate dielectric that covers the ohmic contacts. Ti—Au or Ni—Au gate metal is then deposited, which also serves as metal 1 layer. A SiN interlayer dielectric layer is then deposited using sputtering, PECVD, or other suitable technique. The ILD layer is patterned and may optionally add a source-connected or gate-connected second field plate. A second metal layer is formed using plated Au, sputtered Al or other appropriate material. A passivation layer is then formed over the device using SiN that can be subsequently etched for contacts to the device pads. Embodiments of methods of forming the semiconductor device provide the low leakage characteristic of the GaN MISHFET while shielding the un-gated regions of the device during subsequent processing.

Figure 1:
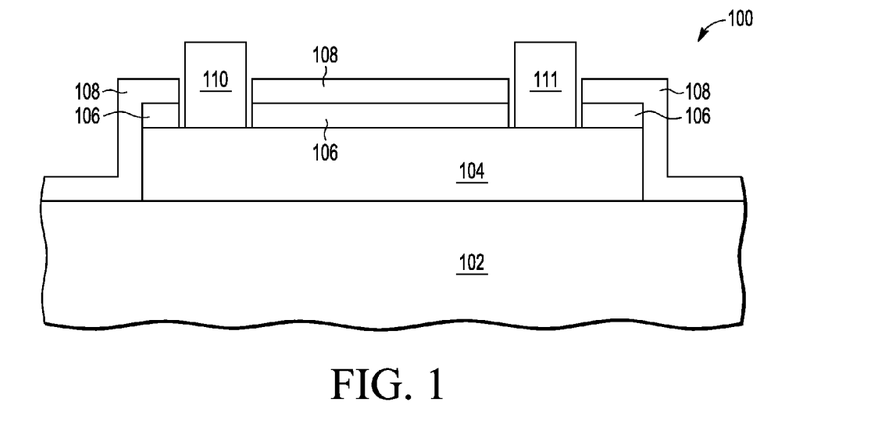
FIGS. 1-9 are simplified cross-sectional views of an embodiment of a semiconductor device at different stages of manufacture.

Referring to FIG. 1, a simplified cross-sectional view of an embodiment of a semiconductor device 100 at one stage of manufacture is shown including semiconductor substrate 102, epitaxial structure 104, one or more insulation or passivation layers 106, 108, and ohmic contacts forming source contact 110 and drain contact 111. Semiconductor substrate 102 can be of sapphire, Si, SiC, poly-SiC, diamond, poly-diamond, GaN, AlN and various other suitable materials. It is desirable that substrate 102 be substantially insulating. Epitaxial structure 104 can range from 0.1 microns to 10 microns thick and can include a buffer layer, a channel layer overlaying the buffer layer, a barrier layer overlaying the channel layer, and a cap layer overlaying the barrier layer. The buffer layer can comprise GaN, GaN and AlN, or AlGaN compounds and have a thickness ranging between 200 Angstroms to 2.4 microns or other suitable thickness. The channel layer can comprise GaN, InGaN, or any appropriate semiconductor with a bandgap less than the barrier layer, and has a thickness ranging between 100 Angstroms to 1 micron or other suitable thickness. The barrier layer can comprise $Al_xGa_{1-x}N$ where X ranges from 0.1 to 0.3 or $In_YAl_{1-Y}N$ where Y=0.1 to 0.2 and has a thickness ranging between 30 Angstroms to 350 Angstroms or other suitable thickness. The cap layer can comprise GaN and have a thickness ranging between 10 Angstroms to 50 Angstroms or other suitable thickness. Components of MOSHFET and/or MISHFET devices are formed on the cap layer.

A heterojunction channel region or channel comprising a two-dimensional electron gas (not shown) forms at the interface between the channel layer and the barrier layer. Electrons in the two-dimensional electron gas concentrate in the channel region, typically within 20-100 Angstroms of the channel layer—barrier layer interface, due to the dissimilar bandgaps and polarization discontinuity between the GaN and AlGaN materials in the respective channel and barrier layers.

The cap layer of epitaxial structure 104 provides protection of the device surface, while the buffer layer provides a transition zone so that crystalline imperfections that may arise at the interface between epitaxial structure 104 and substrate 102 do not significantly detract from device performance.

Epitaxial layers are formed on substrate 102 by, for example, Metal-Organo Chemical Vapor Deposition (MOCVD) or Molecular Beam Epitaxy (MBE). A nucleation layer of GaN or AlGaN may be provided on substrate 102 prior to growth of GaN, to induce epitaxial structure 104 to form a crystalline structure. Epitaxial layers have a total thickness in the range of about 1 to 3 micrometers, in some embodiments about 2 to 2.5 micrometers, but thicker and thinner layers may also be used.

Wafers may be provided with substrate 102 and epitaxial layers covering the surface of substrate 102. Two or more epitaxial structures 104 can be formed by removing the epitaxial layers between epitaxial structures 104 through etching, by ion implantation to damage and isolate areas of the epitaxial layers, and/or a combination of ion implantation and etching. Once epitaxial structure(s) 104 are formed, a first passivation layer 106 (e.g., insulating dielectric) is applied, for example, by low-pressure chemical vapor deposition (LPCVD), plasma enhanced chemical vapor deposition (PECVD), evaporation, sputtering or other techniques. Passivation layer 106 substantially renders the exposed surface of epitaxial structure 104 stable and electrically stable (i.e., without significant surface states) and that it remain so during subsequent processing steps.

In some embodiments, epitaxial structure 104 illustrated in FIG. 1 is formed by masking the top surface of epitaxial layers (e.g., with photoresist) and etched using plasma etching, but other etching procedures may also be used. It has been found that, leaving the surface of the epitaxial layers exposed during the process of forming epitaxial structure 104 can create undesirable surface states adjacent channel region or elsewhere, which can cause DC to RF "current collapse" and adversely affect device performance. The problems of substrate leakage currents can be mitigated or avoided by providing one or more insulating or passivation layers 106, 108 on epitaxial structure 104. In the embodiment shown, first passivation (e.g., dielectric) layer 106 is applied prior to etching epitaxial structure 104 and second passivation (e.g., dielectric) layer 108 is applied after etching epitaxial structure 104 but before forming various metal contacts and interconnections. $Si_3N_4$, $SiO_2$, $SiO_xN_y$, AlN, $Al_2O_3$, and combinations or mixtures thereof are suitable dielectrics for both passivation layers. Thicknesses in the range of about 200 to 2000 Angstrom units are useful for passivation layers 106, 108 with about 500 Angstrom units or other suitable thickness, being used in some embodiments. Layers 106 and 108 may comprise the same or different materials, depending upon the needs of the designer and the semiconductor materials chosen for the device. In other embodiments, only one passivation layer may be used. In still further embodiments, passivation layers are not required when epitaxial structure 104 is formed with ion implantation.

Opening are formed in layers 108, 106 to the surface of the cap layer of epitaxial structure 104 to expose the locations desired for source contact 110 and drain contact 111. Photoresist can be used as a mask to etch the openings through layers 108, 106.

Figure 6:
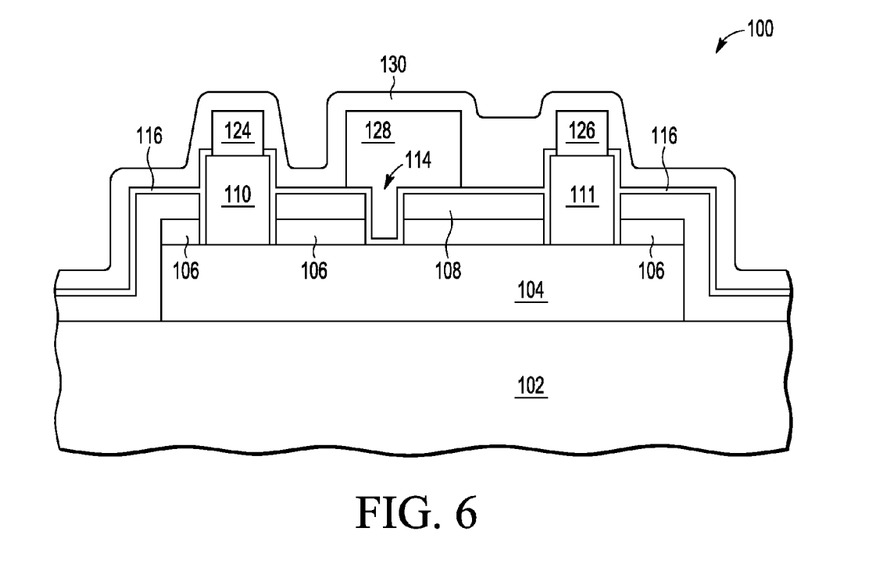

Source contact 110 and drain contact 111 can be formed using a lift-off process taking advantage of the photoresist mask layer used to form the openings for the contacts. Lift-off metallization processes are known in the art but not essential, and a conventional metal deposition and masking and etching sequence may also be used. Contacts 110, 111 can be formed of metals that provide ohmic contact to epitaxial structure 104. When GaN is used for epitaxial structure 104, contacts 110, 111 can include layered TiAlMoAu or TiAlNiAu formed by evaporation, with the Ti layer in contact with epitaxial structure 104. Other metal combinations and formation procedures can also be used. Annealing of contacts 110, 111 to provide ohmic contact to the channel can be accomplished using either a furnace or rapid thermal annealer (RTA) and can be performed at this step or at any other step in the process preceding the deposition of the gate conductor 128 (FIG. 6).

Figure 2:
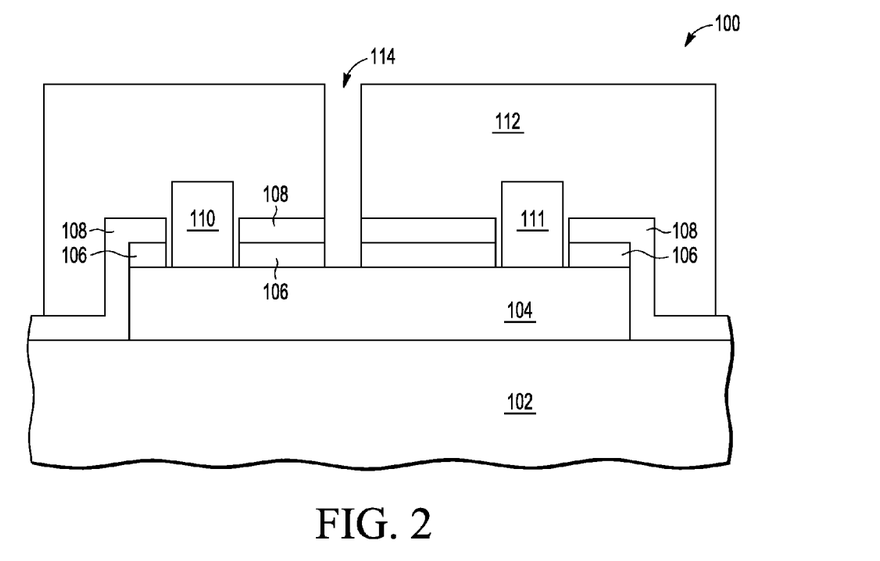

Referring to FIG. 2, a simplified cross-sectional view of semiconductor device 100 is shown at a subsequent stage of manufacture. Photoresist layer 112 is formed over device 100 and gate opening 114 is formed through layers 108, 106 to the top surface of epitaxial structure 104 where the gate channel region is desired to be located. The opening 114 may be located closer to source contact 110 than drain contact 111.

Figure 3:
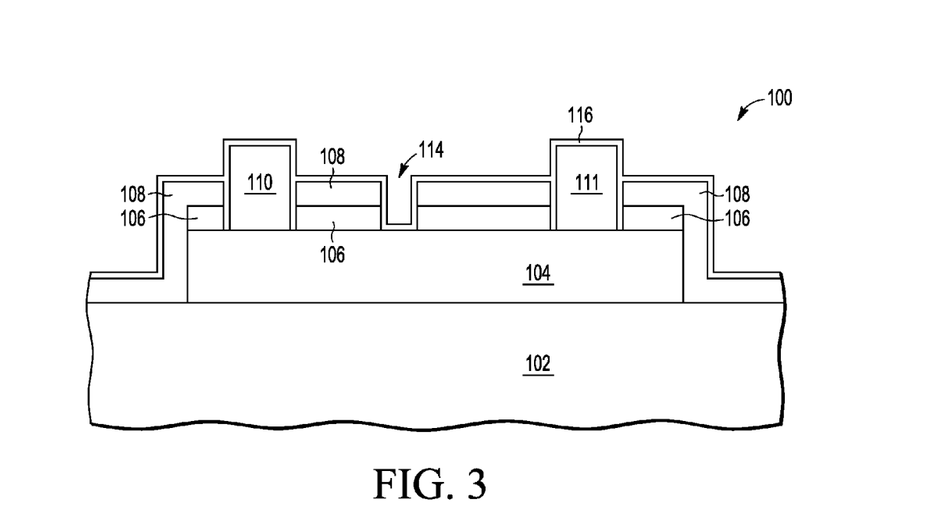

Referring to FIG. 3, a simplified cross-sectional view of semiconductor device 100 is shown at a subsequent stage of manufacture. The surface of device 100 may then be cleaned with either ammonium hydroxide, buffered oxide etch (BOE), ozone cleaning, a combination of these or other suitable technique. Gate dielectric layer 116 can be deposited in the bottom and along the sides of gate opening 114 as well as over the remaining exposed portions of device 100, as shown in FIG. 3 using $Al_2O_3$, $HfO_2$, $LaAlO_3$, $SiO_2$, or other suitable dielectric material deposited either in a single layer or in a multi-stack such as $Al_2O_3/HfO_2$ or $LaAlO_3/SiO_2$. A thickness in the range of about 50 to 500 Angstrom units or other suitable thickness can be used for gate dielectric layer 116 with about 100 Angstrom units being used in some embodiments. Gate dielectric layer 116 can then be annealed using rapid thermal annealing in a temperature range of 200 C-600 C in an $N_2$, $O_2$, or other suitable ambient. In some embodiments, gate dielectric layer 116 is annealed at a temperature ranging between 300-350 degrees Centigrade.

Figure 4:
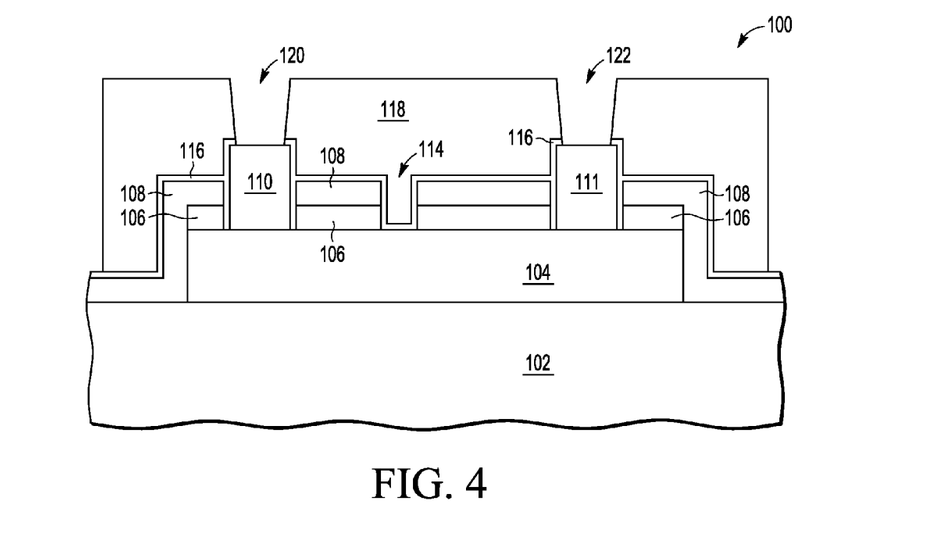

Referring to FIG. 4, a simplified cross-sectional view of semiconductor device 100 is shown at a subsequent stage of manufacture. A chlorine-based or other appropriate chemistry can be used to dry-etch the portions of dielectric layer 116 to form openings 120, 122 over contacts 110, 111.

Figure 5:
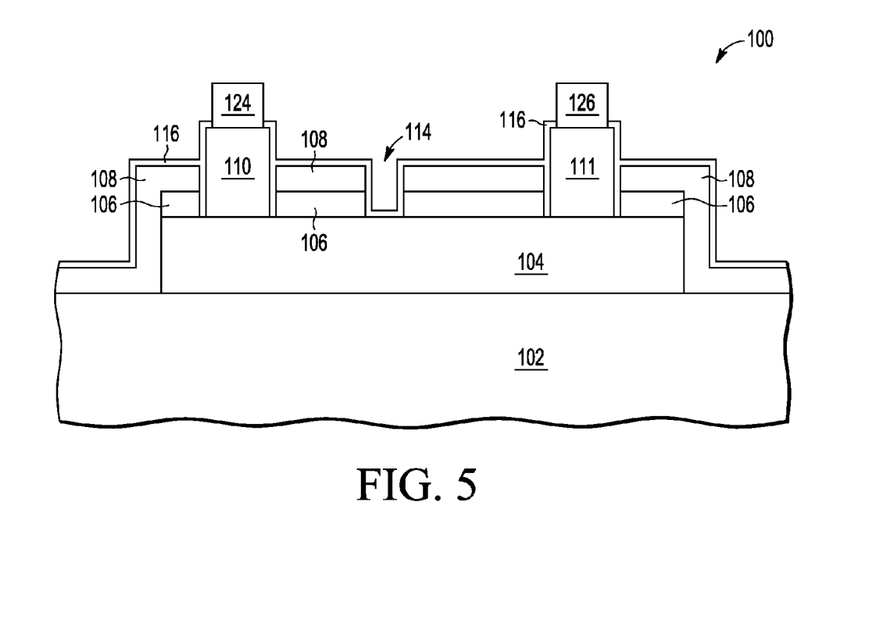

Referring to FIG. 5, a simplified cross-sectional view of semiconductor device 100 is shown at a subsequent stage of manufacture. Following the etch, Ti—Au or Ni—Au gate metal which also serves as metal 1 is deposited in openings 120, 122 to form metal 1contacts 124, 126 as shown in FIG. 5. A thickness in the range of about 4000 to 8000 Angstrom units or other suitable thickness, can be used for metal 1 contacts 124, 126 with about 4000 Angstrom units being used in some embodiments. Metal 1 contacts 124, 126, can be formed using a lift-off process taking advantage of the photoresist mask layer used to form the openings for the contacts. A different conventional metal deposition and masking and etching sequence or other suitable technique may alternatively be used.

Referring to FIG. 6, a simplified cross-sectional view of semiconductor device 100 is shown at a subsequent stage of manufacture in which gate 128, such as a gate electrode, is patterned and formed covering the sides and bottom of gate opening 114. A conventional photoresist step can be used to define the lateral extent of gate. In some embodiments, the length (in the source-drain direction) of gate somewhat larger than the depth of gate opening 114 so that gate 128 overlaps passivation layers 106, 108 on either side of gate opening 114. The overlap of gate 128 may be greater toward the direction of drain contact 111 than source contact 110 to modulate the gate field. Ni and Pt are suitable metals for forming a gate 128 on GaN. Additionally, gate 128 can be a layered structure, as for example, Ni—Au or Pt—Au with about 100 to 1000 Angstroms of Ni or Pt to provide the desired contact, surrounded by several thousand Angstrom units of Au to provide lower resistance, but other metals, semi-metals, semiconductors and combinations thereof can also be used for gate 128. Vacuum evaporation is a suitable technique for forming gate 128, but other deposition processes may alternatively be used. In further embodiments, gate 128 may be formed at the same time using the same photoresist step as metal 1 contacts 124, 126.

An interlayer dielectric (ILD) layer 130 is deposited over device 100 SiN or other suitable dielectric material. A thickness in the range of about 1000 to 50000 Angstrom units or other suitable thickness, can be used for dielectric layer 130 with about 4000 Angstrom units being used in some embodiments.

Figure 7:
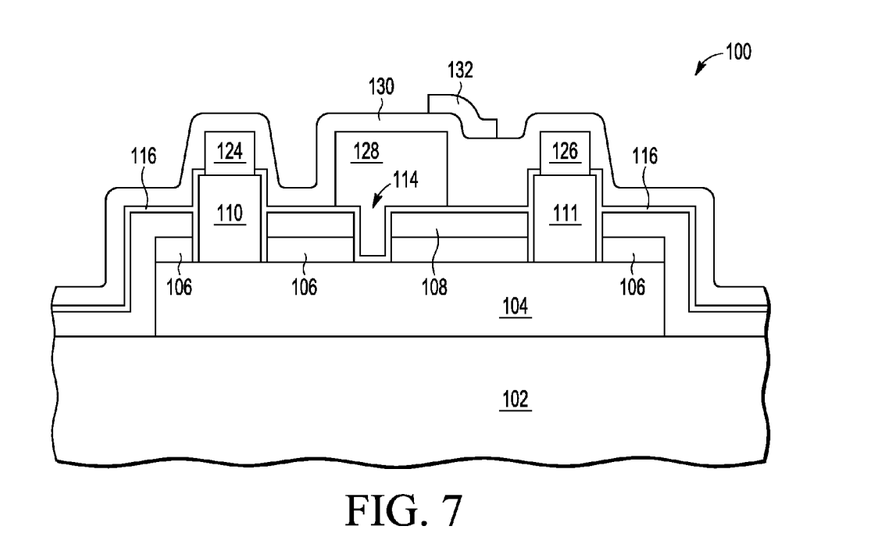

Referring to FIG. 7, a simplified cross-sectional view of semiconductor device 100 is shown at a subsequent stage of manufacture in which field plate 132 can be formed above dielectric layer 130. Field plate 132 may be connected to source metal 1 contact 124 or gate 128. Field plate 132 can be formed of Ni, Ti, or Au material or a combination thereof using a lift-off process, a metal deposition/masking/etching sequence, or other suitable technique. The thickness of field plate 132 can range from about 2000 to 10000 Angstrom units or other suitable thickness, with about 7000 Angstrom units being used in some embodiments.

Figure 8:
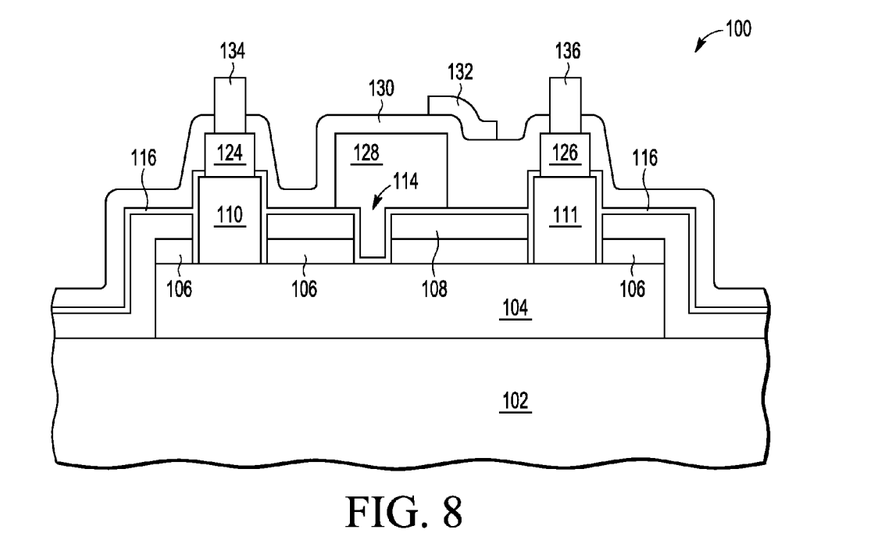

Referring to FIG. 8, a simplified cross-sectional view of semiconductor device 100 is shown at a subsequent stage of manufacture in which metal 2 contacts 134, 136 are formed above respective source metal 1 contact 124 and drain metal 1 contact 126 using plated Au, evaporated Au, sputtered Al or other appropriate materials and techniques. The thickness of metal 2 contacts 134, 136 can range from about 1000 to 200000 Angstrom units or other suitable thickness, with about 50000 Angstrom units being used in some embodiments.

Figure 9:
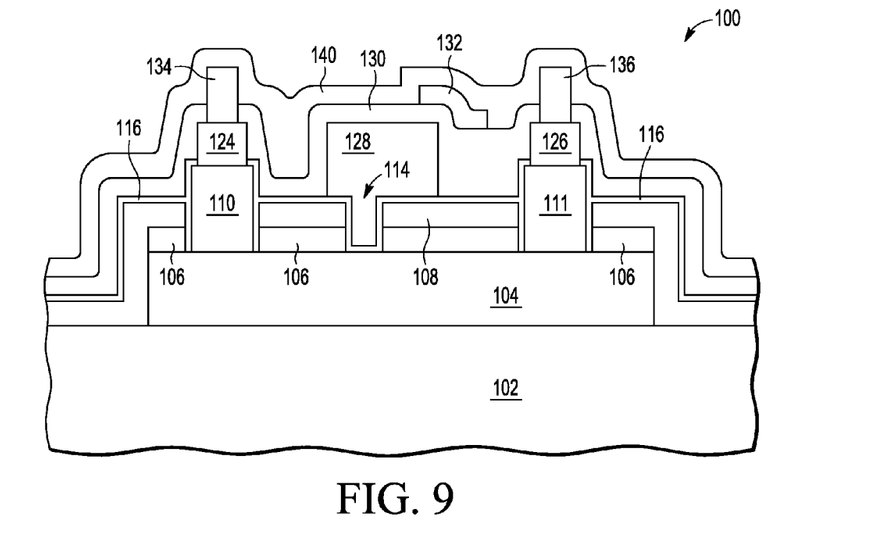

Referring to FIG. 9, a simplified cross-sectional view of semiconductor device 100 is shown at a subsequent stage of manufacture during which passivation layer 140 is formed over device 100 using sputtered SiN or other suitable material. The thickness of passivation layer 140 can range from about 1000 to 50000 Angstrom units or other suitable thickness, with about 4000 Angstrom units being used in some embodiments. Passivation layer 140 can be subsequently etched for contacts to metal 2 contacts 134, 136.

Device 100 provides the low leakage characteristic of the GaN MISHFET while gate dielectric layer 116 shields the un-gated regions of the device 100 during processing.

Figure 10:
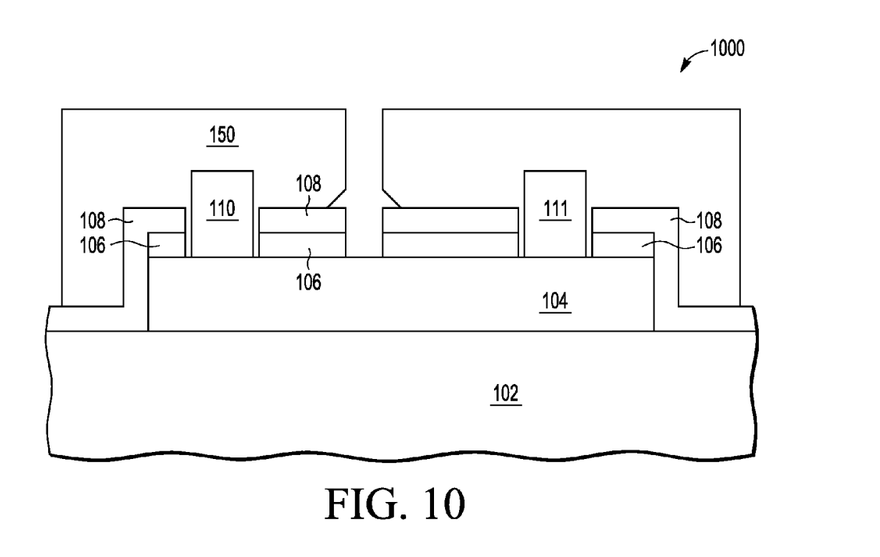
FIGS. 10-12 are simplified cross-sectional views of another embodiment of a semiconductor device at different stages of manufacture.
Figure 11:
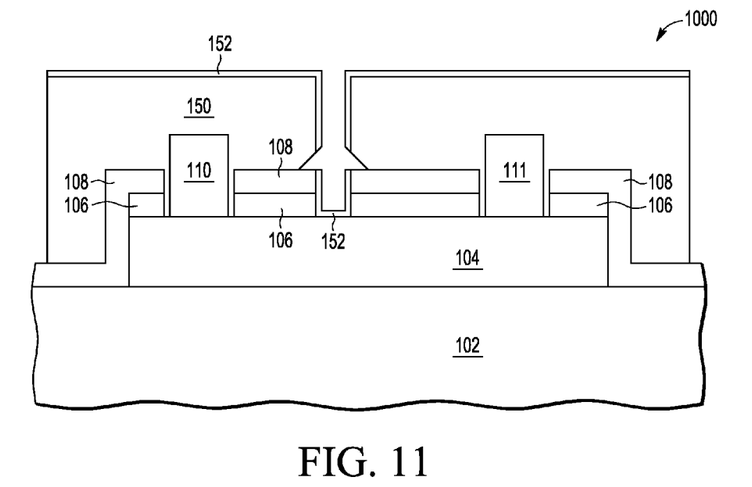
Figure 12:
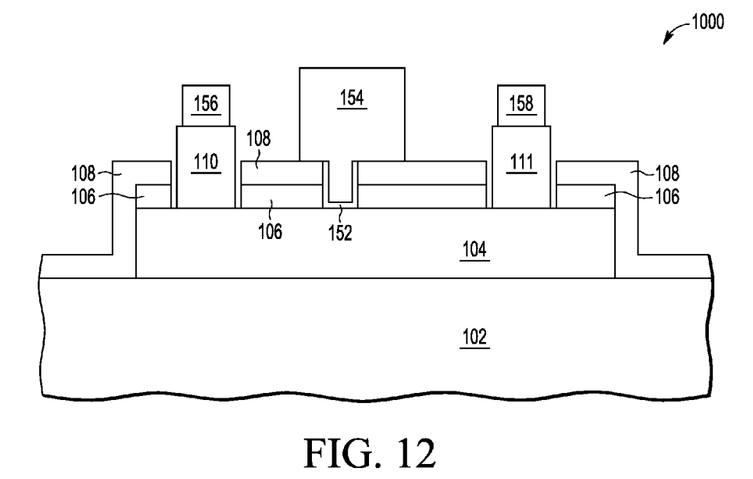

FIGS. 10-12 show a simplified cross-sectional view of another embodiment of a semiconductor device 1000 during stages of manufacture that replace the stages shown in FIGS. 2-5 and described above. Thus, in the second embodiment, device 1000 may be processed as described above and shown in FIGS. 1 and 2. Then, referring to FIG. 10, instead of cleaning the surface and depositing gate dielectric layer 116 (FIG. 3), a layer of lift-off photoresist 150 may be deposited over device 1000 and etched to form gate opening 114 through passivation layers 106, 108 to the top surface of epitaxial layers 104. Photoresist layer 150 can be etched to include an undercut opening 153 adjacent the top surface of epitaxial layers 104 that is larger than the rest of opening 114 to provide better lift-off than a photoresist layer without an undercut.

Referring to FIG. 11, a subsequent stage of manufacture is shown in which photoresist layer 150 has been cleaned using a wet-chemical BOE. Following the cleaning process, gate dielectric layer 152 is deposited directly on the top of photoresist layer 150 and on the bottom and sides (except undercut 153) of gate opening 114. $Al_2O_3$, $HfO_2$, $LaAlO_3$, $SiO_2$, or other suitable dielectric material can be used for gate dielectric layer 152. A thickness in the range of about 50 to 500 Angstrom units or other suitable thickness can be used for gate dielectric layer 152 with about 100 Angstrom units being used in some embodiments. Gate dielectric layer 152 is deposited at temperature less than a temperature that would cause photoresist layer 150 to reticulate, such as 200 degrees Centigrade. Additionally, since the gate dielectric is deposited at relatively low temperature in this embodiment, the annealing conditions are adjusted to achieve optimum dielectric performance. For example, the $Al_2O_3$ can be annealed at 350 C in a $N_2$ or $O_2$ ambient at a later step after the photoresist 150 is removed and the gate dielectric 152 over photoresist 150 are removed.

Referring to FIG. 12, a subsequent stage of manufacture of device 1000 is shown in which openings (not shown) are formed over source contact 110 and drain contact 111, and a conductive material such as Ti—Au or Ni—Au is deposited to form source and drain metal 1 contacts 156, 158 and gate 154 is deposited using a lift-off process. A thickness in the range of about 1000 to 10000 Angstrom units or other suitable thickness, can be used for metal 1 contacts 156, 158 with about 4000 Angstrom units being used in some embodiments. Gate 154 and contacts 156, 158 can be formed using a lift-off process taking advantage of the photoresist mask layer 150. A different conventional metal deposition and masking and etching sequence or other suitable technique may alternatively be used to form openings for contacts 156, 158.

Further processing of device 1000 can be performed using techniques described for FIGS. 5-9 above, or other suitable techniques.

By now it should be appreciated that there has been provided an embodiment of a metal insulator semiconductor heterostructure field effect transistor 100 (MISHFET) comprising a source 110 and a drain on opposing sides of a channel region of a channel layer. The channel region can be an upper portion of the channel layer. The channel layer can comprise gallium nitride and an insulation layer 106, 108 over the channel layer having a first portion and a second portion. The first portion can be nearer the drain than the source and has a first thickness, the second portion can be nearer the source than drain and has the first thickness. The insulation layer 106, 108 has an opening 114 through the insulation layer 106, 108 and between the first portion and the second portion. The MISHFET can further comprise a gate dielectric 116 on a bottom of the opening 114; and a gate 128 on the gate dielectric 116 in the opening 114.

In another aspect, the gate dielectric 116 can be along a sidewall of the opening 114 and over the insulation layer 106, 108.

In a different aspect, the MISHFET can further comprise an interlayer dielectric over the insulation layer 106, 108 and the gate 128.

In another aspect, the interlayer dielectric can be on the insulation layer 106, 108.

In another aspect, a portion of the gate dielectric 116 extends over the insulation layer 106, 108 and the interlayer dielectric can be over the portion of the gate dielectric 116.

In another aspect, the MISHFET can further comprise a first ohmic contact 110 over the source and a second ohmic contact 111 over the drain.

In another aspect, the opening 114 can be closer to the source than to the drain.

In another aspect, the gate extends over the insulation layer 106, 108 extends more from the opening 114 in the direction toward the drain than in the direction toward the source.

In another embodiment, a metal insulator semiconductor heterostructure field effect transistor 100 (MISHFET) having a source and a drain in a channel layer comprising gallium nitride, can comprise an insulation layer 106, 108 over the channel layer between the source and the drain having an opening 114. The source can be spaced from a first side of the opening 114 and the drain can be spaced from a second side of the opening 114. The bottom has an opening 114. A gate dielectric 116 can be on the bottom of the opening 114; and a gate 128 can be on the gate dielectric 116 in the opening 114.

In another aspect, the gate dielectric 116 extends along a sidewall of the opening 114 and can be in contact with the gate 128 along the sidewall, the second side of the opening 114 can be spaced further from the drain than the first side of the opening 114 can be spaced from the source.

In still another embodiment, a method of forming a metal insulator semiconductor heterostructure field effect transistor 100 (MISHFET), can comprise forming a device structure having a substrate 102, an epitaxial structure 104 including a buffer layer, a channel layer, and a cap layer over the substrate 102 having a channel in an upper portion of a channel layer of gallium nitride with a source on a first end of the channel and a drain on a second end of the channel, a first contact 110 and a second contact 111 in which the first contact can be on a source and a second contact can be on a drain, and an insulation layer 106, 108 over the epitaxial structure 104. An opening 114 can be formed in the insulation layer 106, 108 over the channel and spaced from the source and the drain. The opening 114 has a bottom over the channel. A gate dielectric 116 can be formed on the bottom of the opening 114. A gate 128 can be formed on the gate dielectric 116.

In another aspect, the first contact and the second contact are formed from a first metal interconnect layer.

In another aspect the method can further comprise contacting the gate 128 using a second metal interconnect layer.

In another aspect, the forming a device structure can be further characterized by the epitaxial structure 104 comprising an insulating buffer layer over the substrate 102 comprising one of a group consisting of aluminum gallium nitride and aluminum nitride, a gallium nitride layer over the insulating buffer layer in which an upper portion of the gallium nitride layer can be the channel, a barrier layer over the gallium nitride layer, and a cap layer over the barrier layer.

In another aspect, the forming the device structure can be further characterized by the insulation layer 106, 108 comprising a first passivation layer and a second passivation layer over the first passivation layer.

In another aspect, the forming the opening 114 can comprise depositing a photoresist layer, patterning the photoresist layer to form a patterned photoresist layer; and etching the insulation layer 106, 108 using the patterned photoresist layer as a mask to form the opening 114 in the insulation layer 106, 108.

In another aspect, the forming the gate dielectric 116 can comprise depositing the gate dielectric 116 over the patterned photoresist while depositing the gate dielectric 116 on the bottom of the opening 114.

In another aspect the method can further comprise removing the patterned photoresist to thereby remove the gate dielectric 116 over the patterned photoresist from the device structure.

In another aspect the method can further comprise removing the patterned photoresist layer, wherein the forming the gate dielectric 116 on the bottom of the bottom includes simultaneously depositing the gate dielectric 116 over the insulation layer 106, 108 and a sidewall of the opening 114.

In another aspect, the forming the gate 128 on the gate dielectric 116 can be further characterized by the gate being in contact with the gate dielectric 116 on the bottom and the sidewall of the opening 114.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the disclosure described herein are, for example, capable of operation in other orientations than those illustrated or otherwise described herein.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A metal insulator semiconductor heterostructure field effect transistor (MISHFET), comprising:
    a source and a drain on opposing sides of a channel region of a channel layer, wherein the channel region is an upper portion of the channel layer, wherein the channel layer comprises gallium nitride;
    a first insulation layer over the channel layer,
    a second insulation layer over the first insulation layer, the first and second insulation layers each having a first portion and a second portion, wherein the first portion is nearer the drain than the source and has a first thickness, the second portion is nearer the source than drain and has the first thickness, the first and second insulation layers having an opening through the first and second insulation layers and between the first portion and the second portion, wherein the opening extends to the top surface of the channel layer and has a bottom over the channel;
    a gate dielectric on the bottom of the opening;
    a gate dielectric on a bottom of the opening; and a gate on the gate dielectric in the opening.

2. The MISHFET of claim 1, wherein the gate dielectric is along a sidewall of the opening and over the insulation layer.

3. The MISHFET of claim 1, further comprising an interlayer dielectric over the insulation layer and the gate.

4. The MISHFET of claim 3, wherein the interlayer dielectric is on the insulation layer.

5. The MISHFET of claim 4, wherein a portion of the gate dielectric extends over the insulation layer and the interlayer dielectric is over the portion of the gate dielectric.

6. The MISHFET of claim 1, further comprising a first ohmic contact over the source and a second ohmic contact over the drain.

7. The MISHFET of claim 1, wherein the opening is closer to the source than to the drain.

8. The MISHFET of claim 1, wherein the gate extends over the insulation layer extends more from the opening in the direction toward the drain than in the direction toward the source.

9. The MISHFET of claim 1, wherein the channel layer is an epitaxial structure including a buffer layer over the substrate, the channel layer over the buffer layer, a barrier layer over the channel layer, and a cap layer over the barrier layer.

10. The MISHFET of claim 1, wherein the first insulating layer and the channel layer are etched, and the second insulating layer is applied after the first insulating layer and the channel layer are etched.

11. A metal insulator semiconductor heterostructure field effect transistor (MISHFET) having a source and a drain in a channel layer comprising gallium nitride, comprising:
   an insulation layer over the channel layer between the source and the drain having an opening, wherein the source is spaced from a first side of the opening and the drain is spaced from a second side of the opening, wherein the opening has a bottom that extends to the channel layer an opening, wherein the opening extends to the top surface of the channel layer and has a bottom over the channel;
   a gate dielectric on the bottom of the opening; and
   a gate on the gate dielectric in the opening.

12. The MISHFET of claim 11, wherein the gate dielectric extends along a sidewall of the opening and is in contact with the gate along the sidewall, the second side of the opening is spaced further from the drain than the first side of the opening is spaced from the source.

13. The MISHFET of claim 11, wherein the channel layer is an epitaxial structure including a buffer layer over the substrate, the channel layer over the buffer layer, a barrier layer over the channel layer, and a cap layer over the barrier layer.

14. The MISHFET of claim 11, wherein the insulation layer comprises a first passivation layer and a second passivation layer over the first passivation layer, the first passivation layer and the channel layer are etched, and the second passivation layer is applied after the first insulating layer and the channel layer are etched.

15. A metal insulator semiconductor heterostructure field effect transistor (MISHFET), comprising:
   a substrate;
   an epitaxial structure including a buffer layer, a channel layer, and a cap layer over the substrate;
   a channel of gallium nitride in an upper portion of the channel layer;
   a source electrode on a first end of the channel and a drain electrode on a second end of the channel;
   a first contact and a second contact in which the first contact is on the source electrode and the second contact is on the drain electrode;
   an insulation layer over the epitaxial structure;
   an opening through the insulation layer over the channel and spaced from the source electrode and the drain electrode, wherein the opening extends to the top surface of the channel layer and has a bottom over the channel;
   a gate dielectric on the bottom of the opening;
   a gate on the gate dielectric.

16. The MISHFET of claim 15, wherein the first contact and the second contact are formed from a first metal interconnect layer.

17. The MISHFET of claim 16, further comprising a second metal interconnect layer contacting the gate.

18. The MISHFET of claim 15, wherein the epitaxial structure further comprises an insulating buffer layer over the substrate including one of a group consisting of aluminum gallium nitride and aluminum nitride, a barrier layer over the gallium nitride layer, and the cap layer over the barrier layer.

19. The MISHFET of claim 15, wherein the insulation layer comprises a first passivation layer and a second passivation layer over the first passivation layer.

20. The MISHFET of claim 15, wherein the gate dielectric is in direct contact with the channel layer and the gate is in direct contact with the gate dielectric.

* * * * *